United States Patent
Saito et al.

(10) Patent No.: US 11,004,765 B2
(45) Date of Patent: May 11, 2021

(54) FIELD-EFFECT TRANSISTOR WITH A HEAT ABSORBER IN CONTACT WITH A SURFACE OF THE GATE ELECTRODE ON ITS BACK SIDE

(71) Applicant: DENSO CORPORATION, Kariya (JP)

(72) Inventors: Jun Saito, Nagoya (JP); Yusuke Yamashita, Nagakute (JP); Yasushi Urakami, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/667,111

(22) Filed: Oct. 29, 2019

(65) Prior Publication Data

US 2020/0152542 A1 May 14, 2020

(30) Foreign Application Priority Data

Nov. 9, 2018 (JP) .............................. JP2018-211705

(51) Int. Cl.
*H01L 29/78* (2006.01)
*H01L 23/367* (2006.01)
(Continued)

(52) U.S. Cl.
CPC ........ *H01L 23/367* (2013.01); *H01L 23/3736* (2013.01); *H01L 29/0821* (2013.01);
(Continued)

(58) Field of Classification Search
CPC ............. H01L 23/367; H01L 29/41741; H01L 29/0865; H01L 29/1095; H01L 23/3736; H01L 29/0882; H01L 29/0821; H01L 29/7802; H01L 29/7395; H01L 29/4916; H01L 29/417; H01L 29/4232; H01L 23/3677; H01L 29/7828; H01L 29/423; H01L 29/42368

See application file for complete search history.

(56) References Cited

U.S. PATENT DOCUMENTS 5,985,708 A * 11/1999 Nakagawa .......... H01L 27/1203
257/E27.112
6,091,087 A 7/2000 Iwamuro et al.
(Continued)

FOREIGN PATENT DOCUMENTS

JP 10-27900 A 1/1998

*Primary Examiner* — Laura M Menz
*Assistant Examiner* — Pavel G Ivanov
(74) *Attorney, Agent, or Firm* — Sughrue Mion, PLLC

(57) ABSTRACT

A semiconductor device may include a semiconductor substrate, an insulator film covering a part of an upper surface of the substrate, and a gate electrode opposing the upper surface via the insulator film. In the semiconductor substrate, a drift layer extending through a body layer to the upper surface opposes the gate electrode via the insulator film. The insulator film extends from the upper surface of the semiconductor substrate to an upper surface of the gate electrode by passing between the gate electrode and an upper electrode, and defines an opening at the upper surface of the gate electrode. A side surface of the opening of the insulator film is entirely located outside a volume space consisting of all straight lines that passes through the opposing surface of the drift layer at angle of 45 degrees to the opposing surface.

8 Claims, 8 Drawing Sheets

(51) Int. Cl.
    *H01L 29/417*     (2006.01)
    *H01L 29/08*     (2006.01)
    *H01L 29/10*     (2006.01)
    *H01L 23/373*     (2006.01)
    *H01L 29/739*     (2006.01)
    *H01L 29/49*     (2006.01)

(52) U.S. Cl.
    CPC ...... *H01L 29/0865* (2013.01); *H01L 29/0882* (2013.01); *H01L 29/1095* (2013.01); *H01L 29/41741* (2013.01); *H01L 29/4916* (2013.01); *H01L 29/7395* (2013.01); *H01L 29/7802* (2013.01)

(56) References Cited

U.S. PATENT DOCUMENTS

| | | | |
|---|---|---|---|
| 2014/0042460 A1* | 2/2014 | Masuda | H01L 29/66068 257/77 |
| 2015/0295059 A1* | 10/2015 | Wada | H01L 29/66068 257/77 |
| 2016/0268289 A1* | 9/2016 | Noda | H01L 27/11582 |

* cited by examiner

FIELD-EFFECT TRANSISTOR WITH A HEAT ABSORBER IN CONTACT WITH A SURFACE OF THE GATE ELECTRODE ON ITS BACK SIDE

CROSS-REFERENCE TO RELATED APPLICATION

This application claims priority to Japanese patent application No. 2018-211705, filed on Nov. 9, 2018, the entire contents of which are incorporated herein by reference.

TECHNICAL FIELD

The technology disclosed herein relates to a semiconductor device.

BACKGROUND

Japanese Patent Application Publication No. H10-27900 discloses a planar-gate-type semiconductor device. This semiconductor device includes a semiconductor substrate, an insulator film covering a part of an upper surface of the semiconductor substrate, a gate electrode provided in the insulator film and opposing the upper surface of the semiconductor substrate via the insulator film, an upper electrode being in contact with another part of the upper surface of the semiconductor substrate, and a lower electrode being in contact with a lower surface of the semiconductor substrate.

The semiconductor substrate includes an n-type first semiconductor region (a source region or an emitter region) being in contact with the upper electrode at the upper surface, a p-type body layer (also termed a base layer) located around the first semiconductor region and opposing the gate electrode at the upper surface via the insulator film, and an n-type drift layer located between the body layer and the lower electrode. The drift layer partly extends to the upper surface of the semiconductor substrate through the body layer (this part of the drift layer will hereinafter be termed a body-passing part) such that the drift layer includes an opposing surface that opposes the gate electrode via the insulator film at the upper surface of the semiconductor substrate.

SUMMARY

In the planar-gate-type semiconductor device, current density in the body-passing part mentioned above increases, and hence a temperature of the body passing part tends to easily rise. When a large current flows in the semiconductor device, in particular, a voltage drop that occurs in the semiconductor substrate causes extension of a depletion layer from a pn interface with the body layer to the body-passing part. Consequently, the current density further increases in the body-passing part, and the temperature of the body passing part rises more significantly. Such local rise in the temperature of the body-passing part causes the semiconductor substrate to thermally expand locally at the body-passing part, resulting in distortion in the insulator film and/or the gate electrode located immediately above the body-passing part. If the distortion that occurs in the insulator film and/or the gate electrode is excessively large, the insulator film with poor elasticity, for example, may suffer damage such as a crack. If the insulator film suffers damage such as a crack, insulation performance between the gate electrode and the upper electrode (or the semiconductor substrate) is decreased, so that the semiconductor device may fail to, for example, normally operate.

In view of the above-described problem, the present specification provides a technology capable of suppressing damage, such as a crack, occurring to an insulator film.

A semiconductor device disclosed herein may comprise a semiconductor substrate, an insulator film covering a part of an upper surface of the semiconductor substrate, a gate electrode opposing the upper surface of the semiconductor substrate via the insulator film, an upper electrode being in contact with another part of the upper surface of the semiconductor substrate, and a lower electrode being in contact with a lower surface of the semiconductor substrate. The semiconductor substrate includes an n-type first semiconductor region being in contact with the upper electrode at the upper surface of the semiconductor device, a p-type body layer located around the n-type first semiconductor region and opposing the gate electrode at the upper surface of the semiconductor device via the insulator film, and an n-type drift layer located between the p-type body layer and the lower electrode and partly extending to the upper surface through the p-type body layer (i.e., this part is termed a body-passing part) such that the n-type drift layer includes an opposing surface that opposes the gate electrode via the insulator film at the upper surface of the semiconductor device. The insulator film extends from a lower surface of the gate electrode to an upper surface of the gate electrode by passing between the gate electrode and the upper electrode and defines an opening that exposes the upper surface of the gate electrode. A side surface of the opening of the insulator film is entirely located outside a volume space consisting of all straight lines that passes through the opposing surface of the drift layer perpendicularly to the opposing surface.

The damage to the insulator film, as mentioned before, is caused by thermal expansion that occurs locally in the body-passing part. Therefore, the damage to the insulator film tends to occur at a part immediately above the body-passing part and located on the upper surface of the gate electrode. The technology disclosed herein, therefore, adopts a structure in which the insulator film is not provided on the upper surface of the gate electrode in a volume space located immediately above the body-passing part. To be more precise, the volume space located immediately above the body-passing part can be defined as a volume space consisting of all straight lines that pass through the opposing surface of the drift layer and each line is perpendicular to the opposing surface. In the present specification, this volume space region is called a first volume space. In the semiconductor device disclosed herein, the insulator film has been removed from the upper surface of the gate electrode at least in this first volume space. This can effectively suppress damage, such as a crack, occurring to the insulator film even when a short-circuit or the like of an external circuit, for example, causes a flow of an excessively large current in the semiconductor device and local temperature rise in the body-passing part. On the other hand, the insulator film extends from the lower surface of the gate electrode to the upper surface of the gate electrode by passing between the gate electrode and the upper electrode. Therefore, even with an opening formed in the insulator film, insulation performance required between the gate electrode and the upper electrode can sufficiently be maintained.

DETAILED DESCRIPTION

Figure 1:
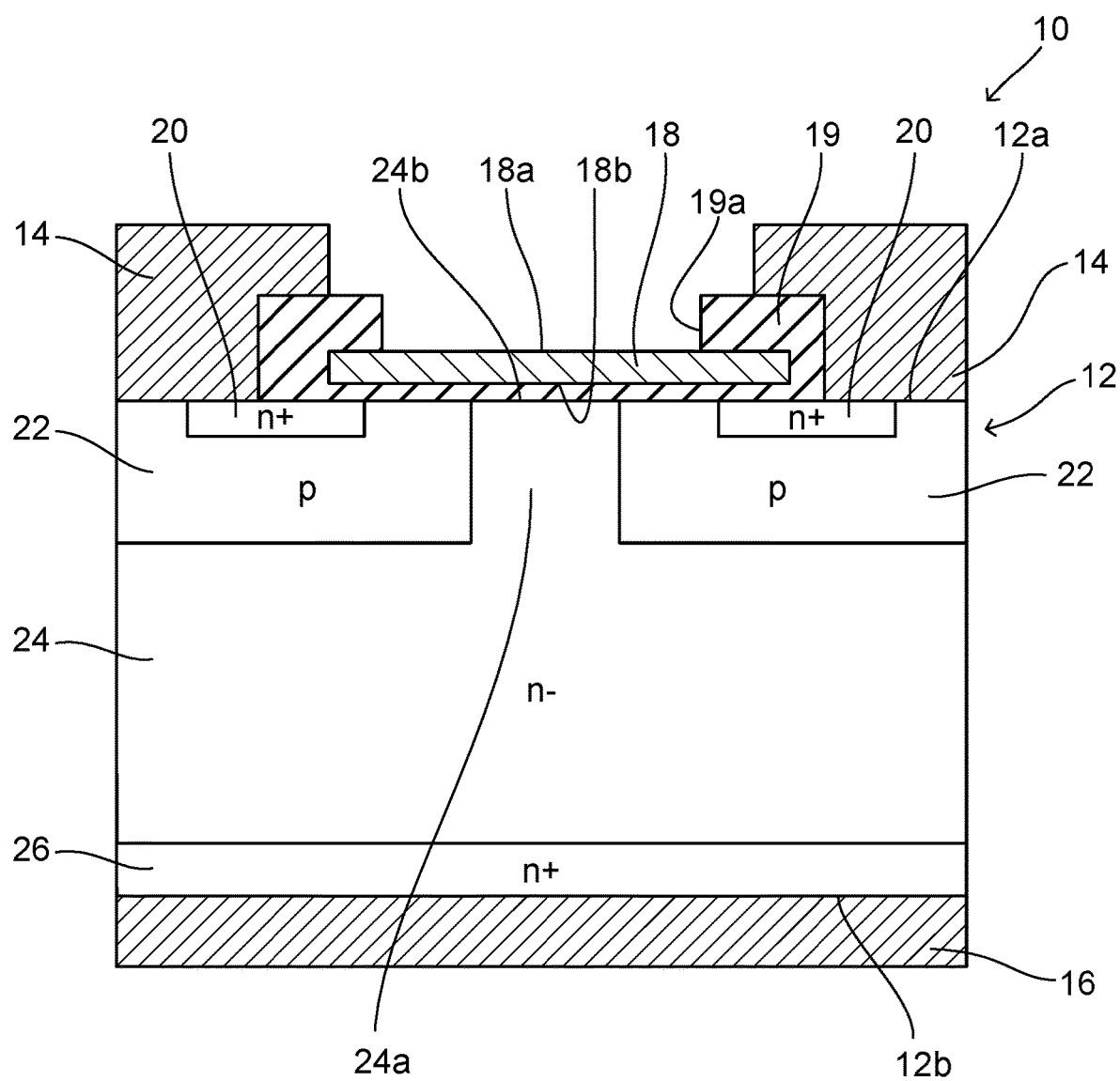
FIG. 1 shows a cross-sectional structure of a semiconductor device 10 in first embodiment.

In an aspect of the present technology, the side surface of the opening of the insulator film is entirely located outside a volume space consisting of all straight lines that passes through the opposing surface of the drift layer at angle of 45 degrees to the opposing surface. Damage to the insulator film may occur not only immediately above the body-passing part (i.e., in the first volume space), but also in a volume space located therearound. In this regard, the present inventors have made examination and found out that damage to an insulator film tends to occur also in a volume space extending upward from the opposing surface of the drift layer that is located on the upper surface of the semiconductor substrate while spreading outward at an angle of 45 degrees. To be more precise, this volume space can be defined as a volume space consisting of all straight lines that pass through the opposing surface of the drift layer at angle of 45 degrees to the opposing surface. In the present specification, this volume space is called a second volume space. With the insulator film removed from the upper surface of the gate electrode not only in the first volume space but also in the second volume space, the damage occurring to the insulator film can further be suppressed.

In an aspect of the present technology, the semiconductor device may further include a heat absorber being in contact with the upper surface of the gate electrode within the opening of the insulator film and having a greater thermal capacity per unit volume than the insulator film. Formation of an opening in the insulator film leads to decrease in thermal capacity of the insulator film, resulting in that heat tends to be accumulated in the semiconductor substrate (particularly in the body-passing part). However, allowing the heat absorber, which has a greater thermal capacity per unit volume than the insulator film, to be in contact with the upper surface of the gate electrode within the opening of the insulator film enables heat generated in the body-passing part to be absorbed by the heat absorber. The temperature rise in the body-passing part is thereby suppressed, and thermal expansion that occurs locally at the body-passing part can be reduced.

In the above-described aspect, at least a part of the upper surface of the gate electrode that is located within the first volume space may be in contact with the heat absorber. According to such a configuration, the heat absorber effectively can absorb heat generated in the body-passing part, and can further suppress temperature rise in the body-passing part.

Additionally to or alternatively of the above, the heat absorber may be constituted of metal. Allowing a heat absorber, which is in contact with the gate electrode, to be constituted of metal can also reduce parasitic resistance of the gate electrode. Reducing the parasitic resistance of the gate electrode can improve a switching speed of the semiconductor device. Specific metal adopted for the heat absorber may not be limited to a particular one. As an example, if the insulator film is constituted of silicon oxide ($SiO_2$), metals that can be adopted for the heat absorber may include gold (Au), silver (Ag), copper (Cu), aluminum (Al), molybdenum (Mo), nickel (Ni), or an alloy including at least one of them as a main component thereof.

As another aspect, the heat absorber may be constituted of conductor other than metal, or may be constituted of insulator. If the heat absorber is constituted of insulator, examples of materials that can be adopted for the insulator may include organic material or polymer material such as resin. The organic material or polymer material are less susceptible to damage such as a crack as in metal, and thus can be adopted as a material of the heat absorber. Moreover, allowing the heat absorber to be constituted of insulator can also enhance insulation performance between the gate electrode and the upper electrode. An example of the material that can be adopted for the heat absorber includes polyimide and epoxy resin.

In an aspect of the present technology, the gate electrode may be constituted of poly-silicon. Moreover, the upper electrode may be constituted of metal. According to such a configuration, heat of the semiconductor substrate is absorbed/dissipated by the gate electrode and/or the upper electrode, and temperature rise in the semiconductor substrate can be suppressed. It should be noted that the material (s) constituting the gate electrode and/or the upper electrode may only need to have electrical conductivity, and is not limited to the materials shown herein.

In an aspect of the present technology, the insulator film may be constituted of insulator that is inorganic material having covalent bonds. Examples of such insulator may include silicon oxide, silicon nitride ($Si_3N_4$), and aluminum nitride (AlN). These materials are typically prone to be damaged when deformed. Therefore, if these materials are adopted for the insulator film, the present technology can bring forth its effects more remarkably.

In an aspect of the present technology, the semiconductor substrate may further comprise an n-type drain layer, the n-type drain layer being located between the n-type drift layer and the lower electrode and being in contact with the lower electrode at the lower surface of the semiconductor substrate. According to such a configuration, the semiconductor device can have a structure of a Metal-Oxide-Semiconductor Field-Effect Transistor (MOSFET). In this case, the first semiconductor region corresponds to a source region of the MOSFET.

In an embodiment of the present technology, the semiconductor substrate may further comprise a p-type collector layer, the p-type collector layer being located between the n-type drift layer and the lower electrode and being in contact with the lower electrode at the lower surface of the semiconductor substrate. According to such a configuration, the semiconductor device can have a structure of an Insulated Gate Bipolar Transistor (IGBT). In this case, the first semiconductor region corresponds to a collector region of the IGBT.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

With reference to the drawings, a semiconductor device 10 in first embodiment will be described. The semiconductor device 10 in the present embodiment is a switching element that belongs to power semiconductor elements, and specifically has a structure of a MOSFET. The semiconductor device 10 can be adopted for a power conversion circuit such as a converter or an inverter in, for example, an automobile. Examples of the automobile herein mentioned include various automobiles each having traction motor(s) that drives wheels, such as hybrid vehicles, fuel-cell vehicles, or electric vehicles.

As shown in FIG. 1, the semiconductor device 10 comprises a semiconductor substrate 12, an insulator film 19 covering a part of an upper surface 12a of the semiconductor substrate 12, a gate electrode 18 opposing the upper surface 12a of the semiconductor substrate 12 via the insulator film 19, an upper electrode 14 provided on the upper surface 12a of the semiconductor substrate 12, and a lower electrode 16 provided on a lower surface 12b of the semiconductor substrate 12. It should be noted that, in the semiconductor device 10 in the present embodiment, the cross-sectional structure shown in FIG. 1 is disposed in continuous fashion along a direction perpendicular to a paper sheet of FIG. 1, and is disposed in repetitious fashion along a right-to-left direction of FIG. 1.

The insulator film 19 is constituted of insulating material. The material constituting the insulator film 19 may be, for example, silicon oxide ($SiO_2$), although such configuration is not limiting. The insulator film 19 is interposed between the upper surface 12a of the semiconductor substrate 12 and the gate electrode 18. Additionally, the insulator film 19 extends from a lower surface 18b of the gate electrode 18 to an upper surface 18a of the gate electrode 18 by passing between the gate electrode 18 and the upper electrode 14. The insulator film 19 defines an opening 19a at the upper surface 18a of the gate electrode 18. In other words, the insulator film 19 partly covers the upper surface 18a of the gate electrode 18. The insulator film 19 will be described in details later.

As mentioned before, the gate electrode 18 opposes the upper surface 12a of the semiconductor substrate 12 via the insulator film 19. It should be noted that, the lower surface 18b of the gate electrode 18 means a surface of the gate electrode 18 located on a semiconductor substrate 12 side, and the upper surface 18a of the gate electrode 18 means a surface of the gate electrode 18 located on a side opposite from the semiconductor substrate 12. The gate electrode 18 is constituted of material having electrical conductivity, and an example of the material that can be adopted therefor includes poly-silicon. The gate electrode 18 is electrically insulated from the semiconductor substrate 12 and the upper electrode 14 by the insulator film 19.

The upper electrode 14 is in contact with another part of the upper surface 12a of the semiconductor substrate 12 (i.e., a part not covered by the insulator film 19). The lower electrode 16 is in contact with the lower surface 12b of the semiconductor substrate 12. The upper electrode 14 and the lower electrode 16 are constituted of material having electrical conductivity. Examples of a material that can be adopted for these electrodes include metal materials such as aluminum (Al), nickel (Ni), titanium (Ti), gold (Au), although such configuration is not limiting. It should be noted that the specific configuration of each of the upper electrode 14 and the lower electrode 16 is not limited to a particular one. The upper electrode 14 is in ohmic contact with the upper surface 12a of the semiconductor substrate 12, and the lower electrode 16 is in ohmic contact with the lower surface 12b of the semiconductor substrate 12.

Here, the upper surface 12a of the semiconductor substrate 12 means one main surface of the semiconductor substrate 12, and the lower surface 12b of the semiconductor substrate 12 means another main surface of the semiconductor substrate 12 that is located opposite to the upper surface 12a. In the present specification, the expressions "upper surface" and "lower surface" are for distinguishing between two surfaces located opposite to each other for convenience, and do not limit an orientation of the semiconductor device 10 during manufacturing or during use.

The semiconductor substrate 12 comprises a source region 20, a body layer 22, a drift layer 24, and a drain layer 26. As an example, the semiconductor substrate 12 in the present embodiment is a silicon carbide (SiC) substrate. It should be noted that the semiconductor substrate 12 may also be a substrate constituted of another semiconductor material such as silicon (Si) or nitride semiconductor.

The source region 20 is an n-type semiconductor region doped with n-type impurities (e.g., group-V elements such as phosphorus). The source region 20 is in contact with the upper electrode 14 at the upper surface 12a of the semiconductor substrate 12. The source region 20 has a sufficiently high impurity concentration, and the upper electrode 14 is in ohmic contact with the source region 20. The source region 20 is also in contact with the insulator film 19 at the upper surface 12a of the semiconductor substrate 12, and a part of the source region 20 opposes the gate electrode 18 via the insulator film 19.

The body layer 22 is a p-type semiconductor region doped with p-type impurities (e.g., Al). The body layer 22 is provided around the source region 20, and isolates the source region 20 from the drift layer 24. The body layer 22 opposes the gate electrode 18 at the upper surface 12a of the semiconductor substrate 12 via the insulator film 19. The body layer 22 is also in contact with the upper electrode 14 at the upper surface 12a of the semiconductor substrate 12. The body layer 22 is thereby configured to be equipotential with the upper electrode 14. As an example, the body layer 22 in the present embodiment has an increased impurity concentration locally in its part that is in contact with the upper electrode 14. When a predetermined gate voltage is applied to the gate electrode 18, a channel (inversion layer) is formed in a part of the body layer 22 that opposes the gate electrode 18. The source region 20 and the drift layer 24 are thereby electrically connected, and the semiconductor device 10 is turned on.

The drift layer 24 is an n-type semiconductor region doped with n-type impurities. The drift layer 24 is located between the body layer 22 and the lower electrode 16 (i.e., below the body layer 22). Moreover, the drift layer 24 includes a body-passing part 24a that extends through the body layer 22 to the upper surface 12a of the semiconductor substrate 12. The body-passing part 24a opposes the gate electrode 18 via the insulator film 19 at the upper surface 12a of the semiconductor substrate 12. Among the upper surface 12a of the semiconductor substrate 12, a part 24b where the drift layer 24 opposes the gate electrode 18 will hereinafter be termed an opposing surface 24b of the drift layer 24. The opposing surface 24b of the drift layer 24 is also an upper end surface of the body-passing part 24a. An impurity concentration in the drift layer 24 is sufficiently lower than the impurity concentration of the source region 20, and is lower than the impurity concentration in the body layer 22.

The drain layer 26 is an n-type semiconductor region doped with n-type impurities. The drain layer 26 is located between the drift layer 24 and the lower electrode 16 and is in contact with the lower electrode 16 at the lower surface 12b of the semiconductor substrate 12. The drain layer 26 has a sufficiently high impurity concentration, and the lower electrode 16 is in ohmic contact with the drain layer 26. Notably, although the drain layer 26 is in contact with the drift layer 24 in the present embodiment, an n-type buffer layer, for example, may be provided between the drain layer 26 and the drift layer 24. In this case, an impurity concentration in the buffer layer may be lower than the impurity concentration in the drain layer 26 and higher than the impurity concentration in the drift layer 24.

Next, with reference to FIG. 2, a detailed structure of the insulator film 19 will be described. As mentioned before, the insulator film 19 defines the opening 19a at the upper surface 18a of the gate electrode 18. This results in that, in a volume space X located immediately above the body-passing part 24a, the insulator film 19 does not exist on the upper surface 18a of the gate electrode 18. Here, to be more precise, the volume space X located immediately above the body-passing part 24a can be defined as a volume space consisting of all straight lines the pass through the opposing surface 24b of the drift layer 24 perpendicularly to the opposing surface 24b. In the present specification, this volume space X is called a first volume space X.

Figure 2:
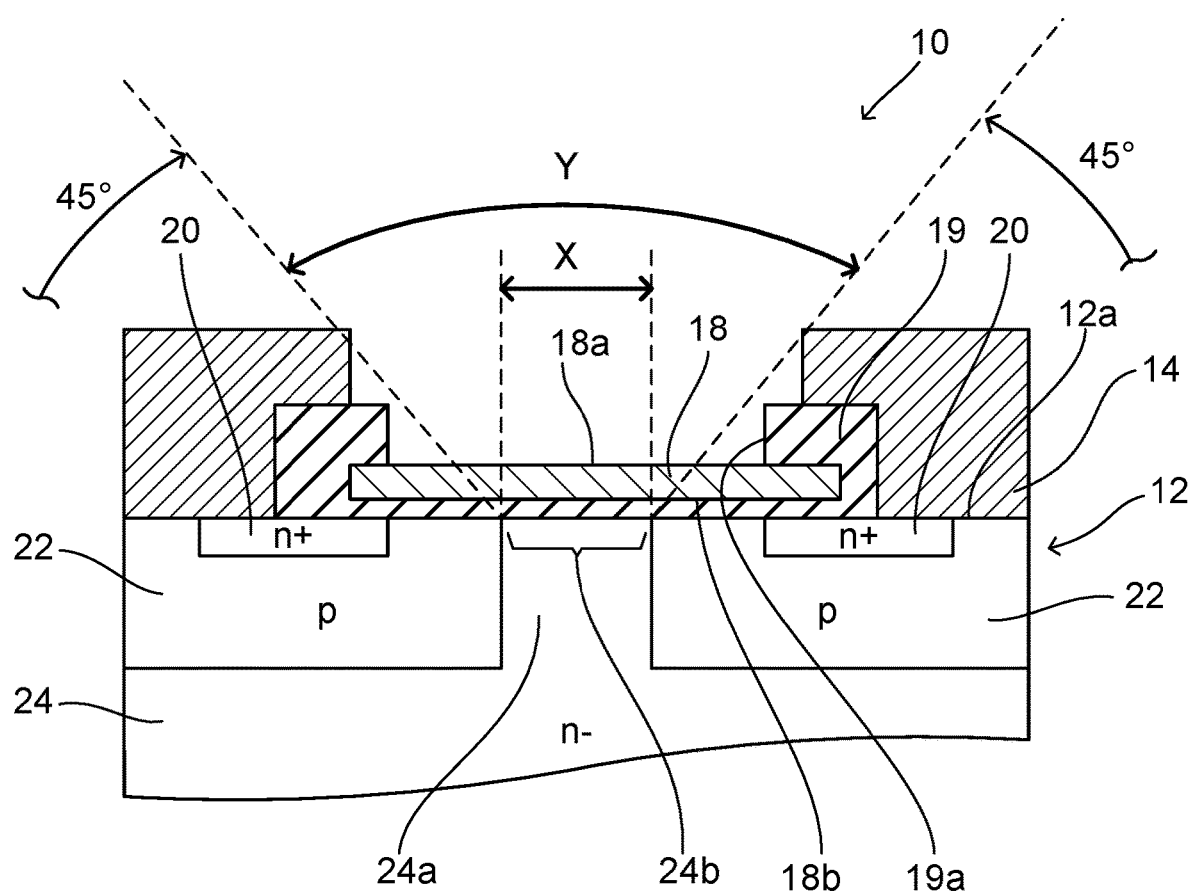
FIG. 2 is a diagram showing a structure of an insulator film 19 in details.

In the semiconductor device 10 in the present embodiment, the insulator film 19 exists neither in the first volume space X nor in a second volume space Y shown in FIG. 2, on the upper surface 18a of the gate electrode 18, although such configuration is not limiting. This second volume space Y is a volume space extending upward from the opposing surface 24b of the drift layer 24 while spreading outward at an angle of 45 degrees. To be more precise, the second volume space Y can be defined as a volume space consisting of all straight lines that pass through the opposing surface 24b of the drift layer 24 at angle of 45 degrees to the opposing surface 24b. A purpose of not providing the insulator film 19 in the first volume space X or the second volume space Y, on the upper surface 18a of the gate electrode 18, is to suppress damage occurring to the insulator film 19, which will specifically be mentioned later.

Figure 3:
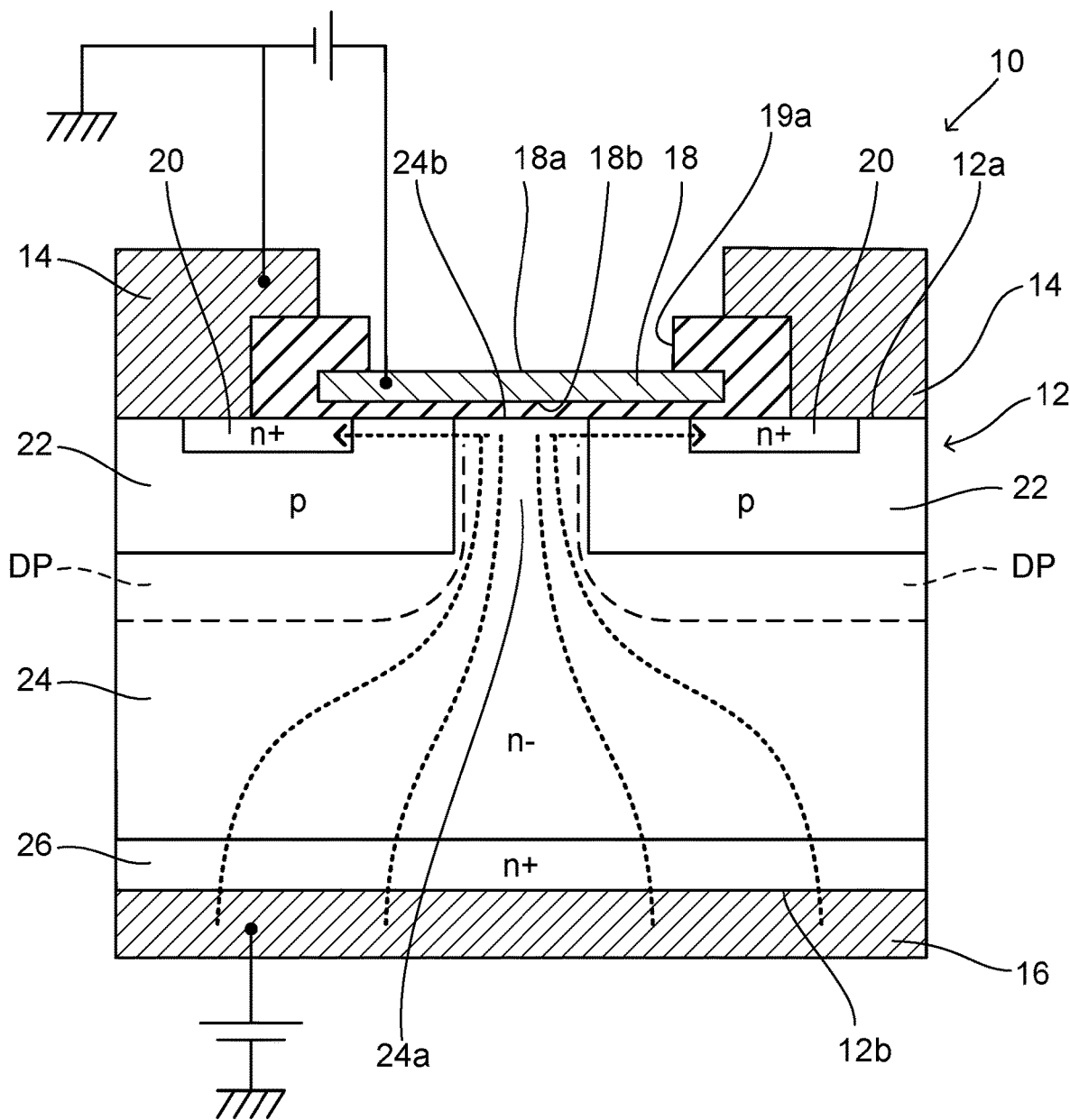
FIG. 3 schematically shows a current (dashed-line arrows) that flows in a semiconductor substrate 12.

Next, with reference to FIG. 3, a characteristic operation of the semiconductor device 10 will be described. As shown in FIG. 3, when a predetermined gate voltage is applied to the gate electrode 18 with respect to the upper electrode 14 in a state where a positive direct-current voltage is applied to the lower electrode 16 with respect to the upper electrode 14, a current flows in the semiconductor substrate 12 from the lower electrode 16 toward the upper electrode 14. At this occasion, as schematically shown by dashed-line arrows in FIG. 3, a current flows while avoiding the body layer 22 in the semiconductor substrate 12. Consequently, the current concentrates on the body-passing part 24a, and the body-passing part 24a has a relatively high current density, and thereby locally rises in temperature. When a large current flows in the semiconductor device 10, in particular, a voltage drop that occurs in the semiconductor substrate 12 causes extension of a depletion layer DP from a pn interface with the body layer 22 to the body-passing part 24a. Consequently, the body-passing part 24a further increases in current density, and more significantly rises in temperature.

Figure 4:
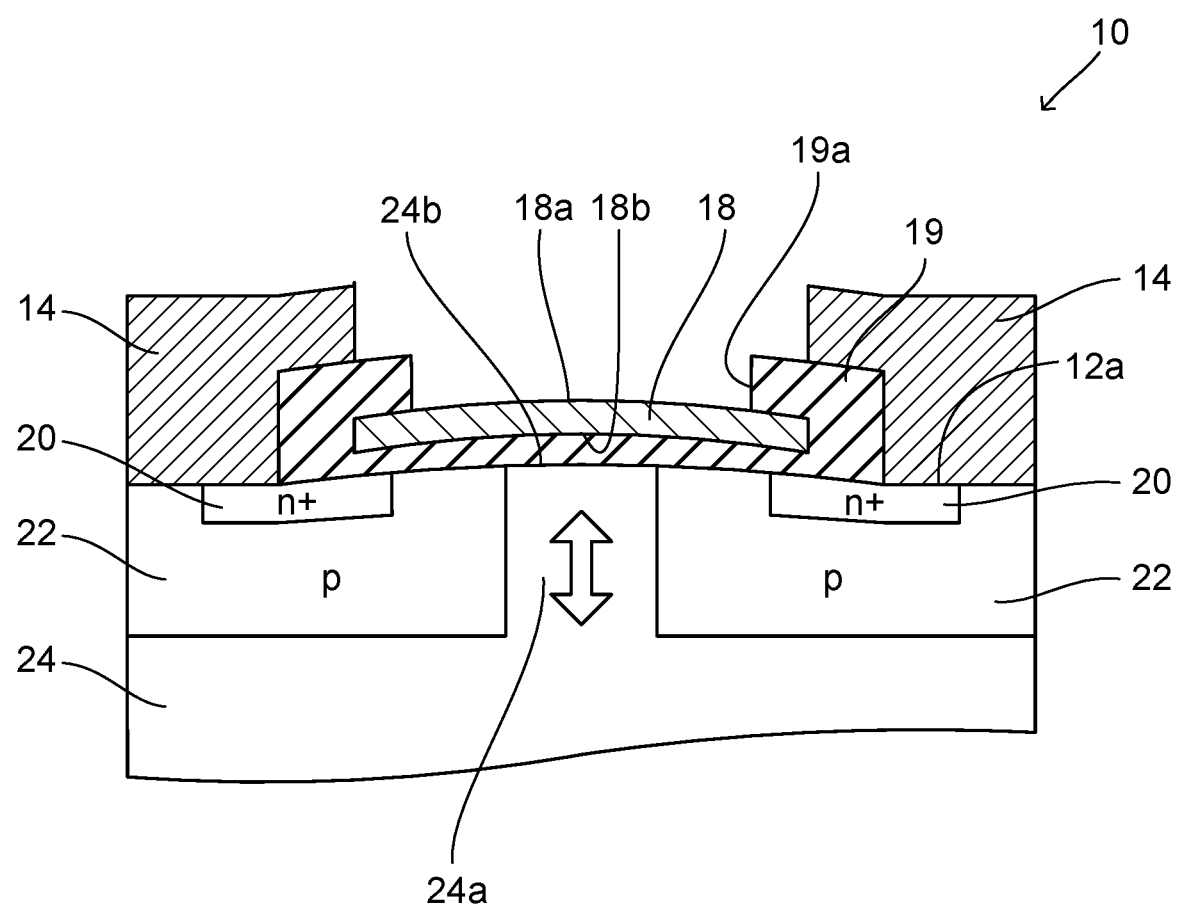
FIG. 4 schematically shows distortion that occurs in the insulator film 19.

As shown in FIG. 4, when the temperature of the body-passing part 24a locally rises, the semiconductor substrate 12 thermally expands locally at the body-passing part 24a. Consequently, distortion occurs in the insulator film 19 and/or the gate electrode 18 located immediately above the body-passing part 24a. When excessively large distortion occurs in the insulator film 19 and/or the gate electrode 18, the insulator film 19 with poor elasticity, for example, may suffer damage such as a crack C (hereinafter simply termed crack C). In the semiconductor device 10 in the present embodiment, however, the insulator film 19 has the opening 19a formed therein, and a part of the upper surface 18a of the gate electrode 18 is not covered by the insulator film 19. The crack C occurring in the insulator film 19 is thereby suppressed.

Figure 8:
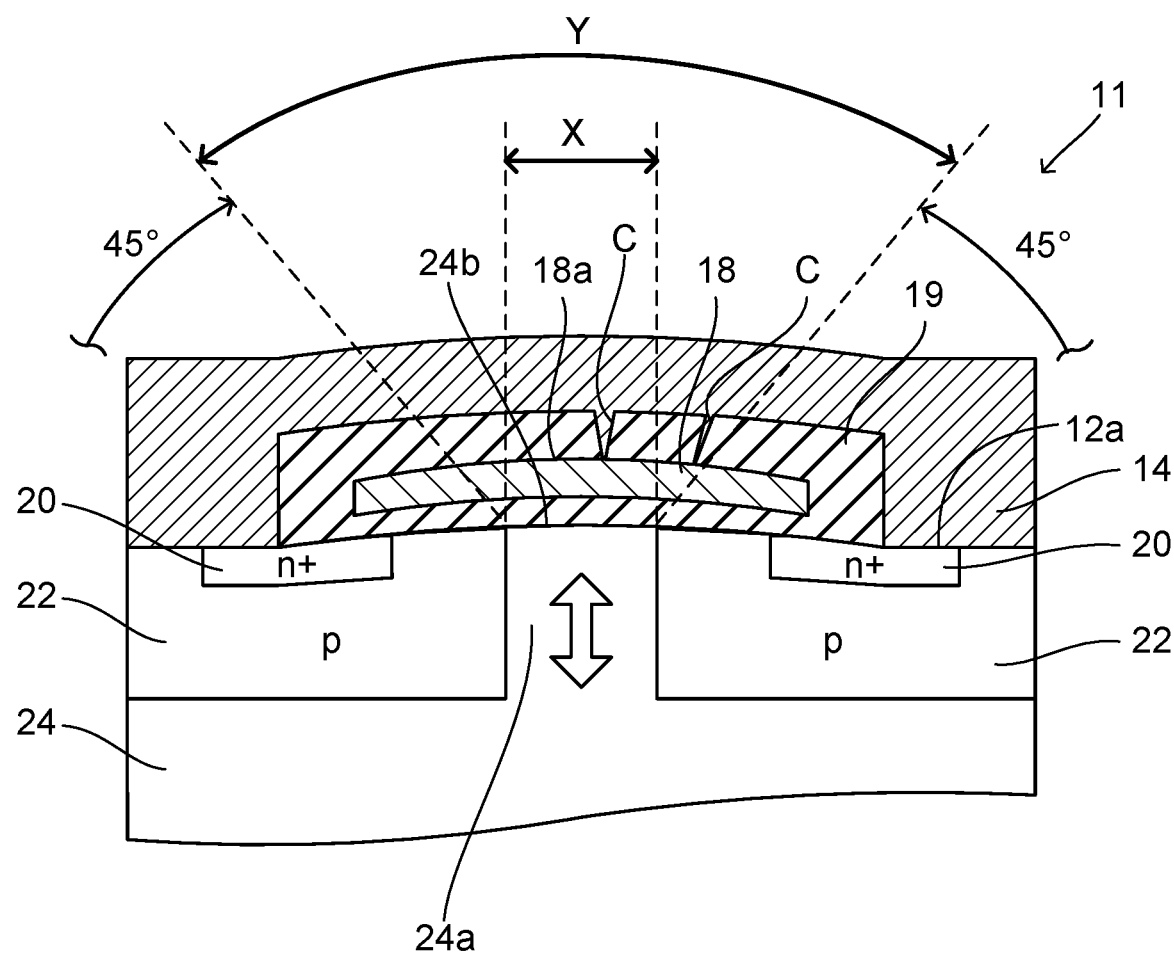
FIG. 8 schematically shows distortion that occurs in the insulator film 19 in a semiconductor device 11 in a comparative example.

In contrast to this, FIG. 8 shows a semiconductor device 11 in a comparative example in a state where distortion has occurred in an insulator film 19. In the semiconductor device 11 in the comparative example, an upper surface 18a of a gate electrode 18 is fully covered by the insulator film 19. With such a structure, when a body-passing part 24a thermally expands locally, excessively large distortion occurs in the insulator film 19 and a crack C may undesirably occur in the insulator film 19. Such damage to the insulator film 19 tends to occur in a part located immediately above the body-passing part 24a (i.e., in a first volume space X) and located at the upper surface 18a of the gate electrode 18. In this regard, the semiconductor device 10 in the present embodiment is configured such that, in the first volume space X, the insulator film 19 does not exist on the upper surface 18a of the gate electrode 18. Therefore, the crack C occurring in the insulator film 19 can effectively be suppressed. Meanwhile, the insulator film 19 extends from the lower surface 18b of the gate electrode 18 to the upper surface 18a of the gate electrode 18 by passing between the gate electrode 18 and the upper electrode 14. Therefore, even with the opening 19a formed in the insulator film 19, insulation performance required between the gate electrode 18 and the upper electrode 14 can sufficiently be maintained.

The crack C in the insulator film 19 may occur not only in the first volume space X but also in a volume space located therearound. In this regard, the present inventors made examination and found out that the crack C in the insulator film 19 tends to occur also in a volume space extending upward from the opposing surface 24b of the drift layer 24 that is located on the upper surface 12a of the semiconductor substrate 12 while spreading outward within an angle range of 45 degrees. This volume space corresponds to the second volume space Y mentioned before. Therefore, as shown in FIG. 2, the semiconductor device 10 in the present embodiment adopts a structure in which the insulator film 19 exists neither in the first volume space X nor in the second volume space Y on the upper surface 18a of the gate electrode 18. Removing the insulator film 19 from the upper surface 18a of the gate electrode 18 in the first volume space X as well as in the second volume space Y can further suppress the crack C occurring in the insulator film 19.

In the semiconductor device 10 in the present embodiment, the insulator film 19 is constituted of silicon oxide. Silicon oxide is insulator that is inorganic material having covalent bonds. Examples of such insulator may include silicon nitride and aluminum nitride, in addition to silicon oxide. These materials are typically prone to be damaged when deformed. Therefore, if these materials are adopted for the insulator film 19, the technology disclosed herein can bring forth its effects more significantly.

Second Embodiment

Figure 5:
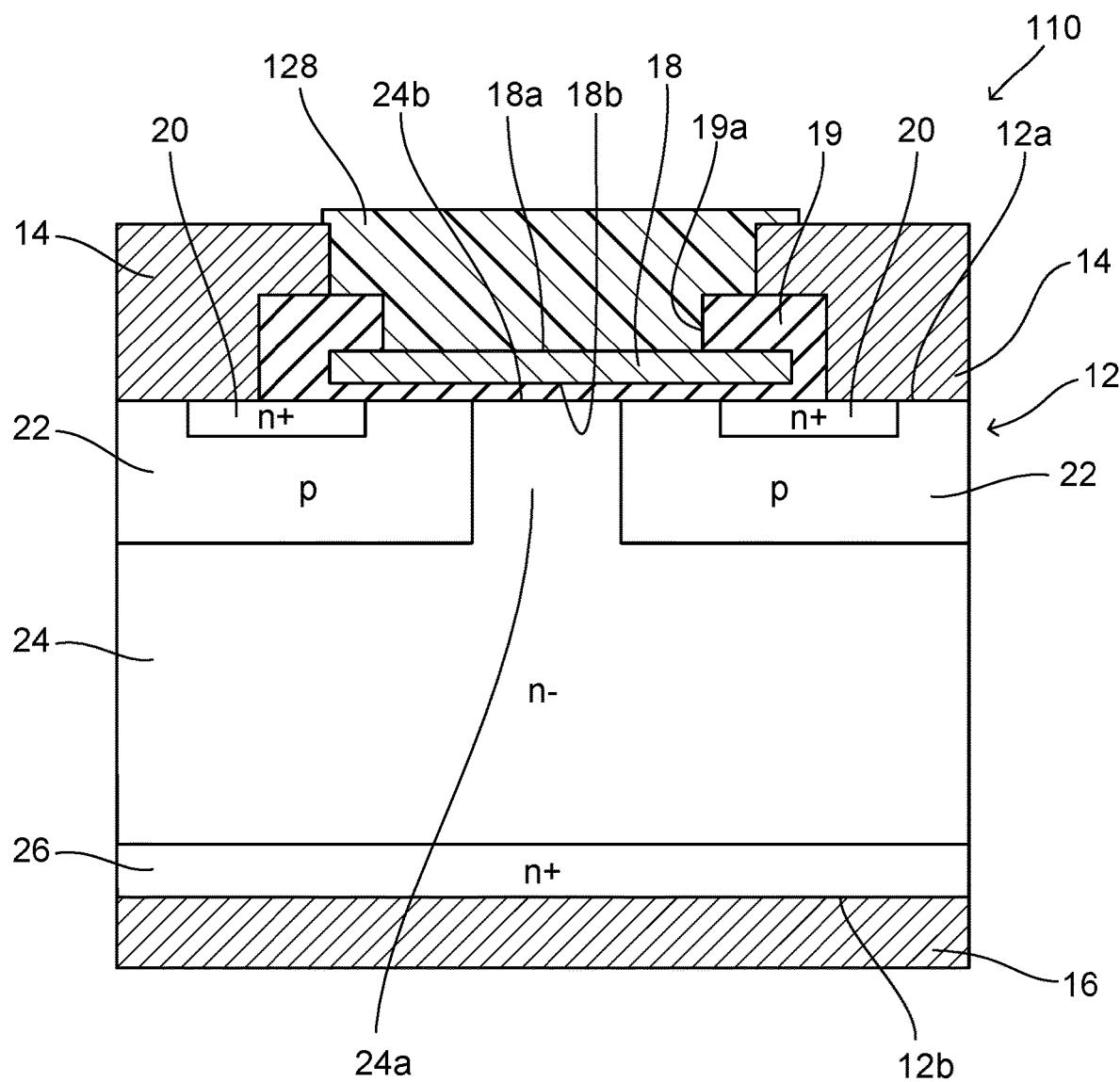
FIG. 5 shows a cross-sectional structure of a semiconductor device 110 in second embodiment.

With reference to FIG. 5, a semiconductor device 110 in second embodiment will be described. In comparison with the semiconductor device 10 in first embodiment, the semiconductor device 110 in the present embodiment further comprises a resin film 128. The resin film 128 covers an entirety of an upper surface 18a of a gate electrode 18 within an opening 19a of an insulator film 19. The resin film 128 is insulator, and hence can enhance insulation performance between the gate electrode 18 and an upper electrode 14. The resin film 128 is constituted of polymer material resin that is organic material, and is less prone to suffer damage such as a crack C than the insulator film 19 constituted of insulator that is inorganic material having covalent bonds. Therefore, even if the resin film 128 exists in the first volume space X and/or the second volume space Y (see FIG. 2), damage occurring to the resin film 128 is normally not expected.

Third Embodiment

Figure 6:
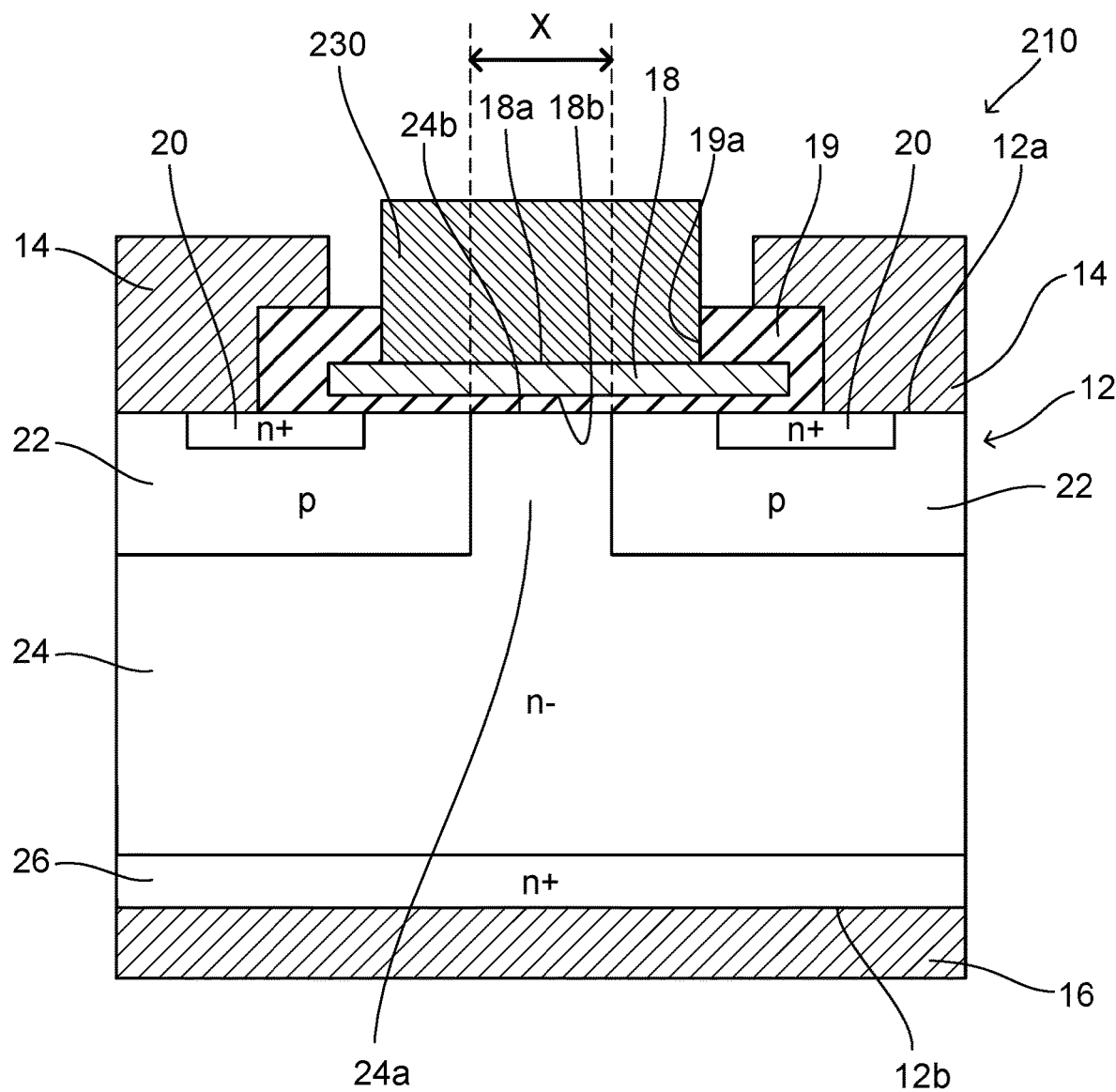
FIG. 6 shows a cross-sectional structure of a semiconductor device 210 in third embodiment.

With reference to FIG. 6, a semiconductor device 210 in third embodiment will be described. In comparison with the semiconductor device 10 in first embodiment, the semiconductor device 210 in the present embodiment further comprises a heat absorber 230. The heat absorber 230 is in contact with an upper surface 18a of a gate electrode 18 within an opening 19a of an insulator film 19. The heat absorber 230 is constituted of material that has a greater thermal capacity per unit volume ($J/K \cdot cm^3$) than the insulator film 19. As an example, the heat absorber 230 in the present embodiment is in contact with the upper surface 18a of the gate electrode 18 over an entirety of the opening 19a of the insulator film 19. However, the heat absorber 230 may only need to be in contact with the upper surface 18a of the gate electrode 18 at at least a part of the opening 19a of the insulator film 19.

The insulator film 19 having the opening 19a formed therein, the insulator film 19 has a reduced thermal capacity, resulting in that heat tends to be easily accumulated in the semiconductor substrate 12 (particularly in the body-passing part 24a). However, when the heat absorber 230, which has a greater thermal capacity per unit volume than the insulator film 19, is in contact with the upper surface 18a of the gate electrode 18 within the opening 19a of the insulator film 19, heat generated in the body-passing part 24a can be absorbed by the heat absorber 230. If a short-circuit occurs in an external circuit connected to the semiconductor device 10, in particular, an excessively large short-circuit current flows in the semiconductor device 10, and the temperature of the body-passing part 24a instantly rises. However, a time for which the short-circuit current flows is excessively short, and an amount of heat generated in the body-passing part 24a is relatively small. Therefore, the heat generated in the body-passing part 24a is sufficiently absorbed by the heat absorber 230. Consequently, temperature rise in the body-passing part 24a is suppressed, and thermal expansion that occurs locally at the body-passing part 24a is reduced.

As mentioned before, the heat absorber 230 may only need to be in contact with the upper surface 18a of the gate electrode 18 within at least a part of the opening 19a of the insulator film 19. It should be noted that the larger contact area the heat absorber 230 has with the upper surface 18a of the gate electrode 18, the faster the heat absorber 230 can absorb heat of the semiconductor substrate 12 via the gate electrode 18. Moreover, the closer the heat absorber 230 becomes to the opposing surface 24b of the drift layer 24, the faster the heat absorber 230 can absorb heat of the semiconductor substrate 12. Given the above, at least a part of the upper surface 18a of the gate electrode 18 that is located within the first volume space X may be in contact with the heat absorber 230, although such configuration not limiting. In other words, the heat absorber 230 may be provided at least immediately above the body-passing part 24a.

The heat absorber 230 in the present embodiment is constituted of metal, although such configuration is not limiting. Allowing the heat absorber 230, which is in contact with the gate electrode 18, to be constituted of metal can also reduce parasitic resistance of the gate electrode 18. Reducing the parasitic resistance of the gate electrode 18 can improve the switching speed of the semiconductor device 210. Specific metal adopted for the heat absorber 230 is not limited to a particular one. As an example, if the insulator film 19 is constituted of any of silicon oxide, silicon nitride, and aluminum nitride, metal that can be adopted for the heat absorber 230 includes gold, silver, copper, aluminum, molybdenum, nickel, or an alloy including at least one of them as a main component. Moreover, the heat absorber 230 may have a multi-layer structure constituted of different materials.

As another embodiment, the heat absorber 230 may be constituted of conductor other than metal, or may be constituted of insulator. If the heat absorber 230 is constituted of insulator, examples of material that can be adopted for the insulator may include organic material and polymer material, such as, for example, resin. Organic material and polymeric material are less likely to suffer damage such as crack C similar to metal, and thus can be adopted as a material of the heat absorber 230. Moreover, allowing the heat absorber 230 to be constituted of insulator can also enhance insulation performance between the gate electrode 18 and the upper electrode 14. In this regard, if the resin film 128 in second embodiment has greater thermal capacity per unit volume ($J/K \cdot cm^3$) than the insulator film 19, the resin film 128 resultingly corresponds to an example of the heat absorber 230.

Fourth Embodiment

Figure 7:
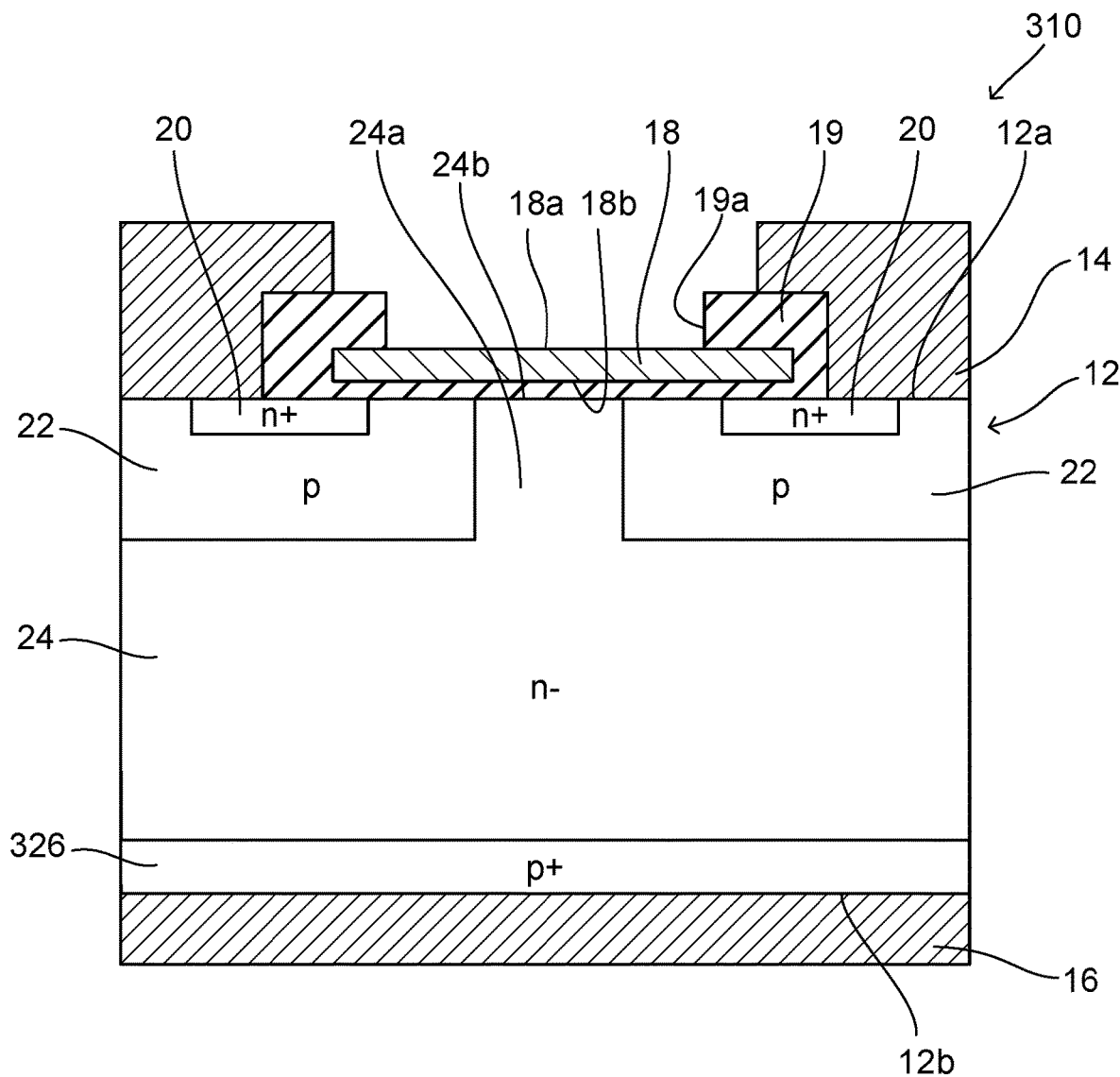
FIG. 7 shows a cross-sectional structure of a semiconductor device 310 in fourth embodiment.

With reference to FIG. 7, a semiconductor device 310 in fourth embodiment will be described. The semiconductor device 310 in the present embodiment differs from the semiconductor device 10 in first embodiment in that it has a structure of an IGBT in place of a MOSFET. Specifically, a semiconductor substrate 12 includes a collector layer 326 in place of the drain layer 26. Other configurations of the semiconductor device 310 are the same as the configurations of the semiconductor device 10 in first embodiment, and hence have like reference numerals attached thereto, so that the description thereof will be omitted. The collector layer 326 is a p-type semiconductor region doped with p-type impurities. The collector layer 326 is located between a drift layer 24 and a lower electrode 16 and is in contact with the lower electrode 16 at a lower surface 12b of the semiconductor substrate 12. An impurity concentration in the collector layer 326 is sufficiently high, and the lower electrode 16 is in ohmic contact with the collector layer 326. Notably, a source region 20 is usually termed an emitter region in an IGBT. As such, the technology disclosed herein can be adopted not only for a MOSFET but also for an IGBT. Furthermore, the technology disclosed herein is not limited to a MOSFET or an IGBT, and can widely be adopted for a planar-gate-type switching element.

What is claimed is:

1. A semiconductor device comprising:
    a semiconductor substrate;
    an insulator film covering a part of an upper surface of the semiconductor substrate;
    a gate electrode opposing the upper surface of the semiconductor substrate via the insulator film;
    an upper electrode being in contact with another part of the upper surface of the semiconductor substrate; and
    a lower electrode being in contact with a lower surface of the semiconductor substrate,
    wherein the semiconductor substrate comprises:
    an n-type first semiconductor region being in contact with the upper electrode at the upper surface of the semiconductor substrate;
    a p-type body layer located around the n-type first semiconductor region and opposing the gate electrode at the upper surface of the semiconductor substrate via the insulator film; and
    an n-type drift layer located between the p-type body layer and the lower electrode and partly extending to the upper surface of the semiconductor substrate through the p-type body layer such that the n-type drift layer comprises an opposing surface that opposes the gate electrode via the insulator film at the upper surface of the semiconductor substrate,
    wherein the insulator film extends from a lower surface of the gate electrode to an upper surface of the gate electrode by passing between the gate electrode and the upper electrode and defines an opening that exposes the upper surface of the gate electrode,
    a side surface of the opening of the insulator film is entirely located outside a volume space consisting of all straight lines that pass through the opposing surface of the drift layer at angle of 45 degrees to the opposing surface, and
    the semiconductor device further comprises a heat absorber being in contact with the upper surface of the gate electrode within the opening of the insulator film and having a greater thermal capacity per unit volume than the insulator film.

2. The semiconductor device according to claim 1, wherein at least a part of the upper surface of the gate electrode that is located within the first region is in contact with the heat absorber.

3. The semiconductor device according to claim 1, wherein the heat absorber is constituted of metal.

4. The semiconductor device according to claim 1, wherein
    the gate electrode is constituted of poly-silicon, and
    the upper electrode is constituted of metal.

5. The semiconductor device according to claim 1, wherein the insulator film is constituted of insulator that is inorganic material having covalent bonds.

6. The semiconductor device according to claim 5, wherein the insulator constituting the insulator film is any one of silicon oxide, silicon nitride and aluminum nitride.

7. The semiconductor device according to claim 1, wherein the semiconductor substrate further comprises an n-type drain layer, the n-type drain layer being located between the n-type drift layer and the lower electrode and being in contact with the lower electrode at the lower surface of the semiconductor substrate.

8. The semiconductor device according to claim 1, wherein the semiconductor substrate further comprises a p-type collector layer, the p-type collector layer being located between the n-type drift layer and the lower electrode and being in contact with the lower electrode at the lower surface of the semiconductor substrate.

* * * * *